(12) United States Patent
Liao

(10) Patent No.: US 6,327,160 B1
(45) Date of Patent: Dec. 4, 2001

(54) CIRCUIT BOARD RETAINER

(75) Inventor: Nien-Chiang Liao, Lu-Chou (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/428,268

(22) Filed: Oct. 27, 1999

(30) Foreign Application Priority Data

Mar. 25, 1999 (TW) ................................................ 88204571

(51) Int. Cl.$^7$ ...................................................... H05K 7/04
(52) U.S. Cl. .......................... 361/809; 361/801; 361/786; 361/759; 24/563
(58) Field of Search ..................................... 361/740, 747, 361/759, 801, 809, 816, 789, 786, 769; 24/563

(56) References Cited

U.S. PATENT DOCUMENTS

| | | | |
|---|---|---|---|
| 2,227,761 | * | 1/1941 | Roethel ..................................... 24/73 |
| 3,501,117 | * | 3/1970 | Soltysik .................................. 248/71 |
| 4,114,339 | * | 9/1978 | Ito .......................................... 52/507 |
| 5,267,125 | * | 11/1993 | Liu ...................................... 361/816 |

* cited by examiner

Primary Examiner—Jeffrey Gaffin
Assistant Examiner—Thanh Y. Tran
(74) Attorney, Agent, or Firm—Wei Te Chung

(57) ABSTRACT

A circuit board retainer includes a U-shaped body portion having a base plate and two side plates extending from the base plate. A panel connecting portion includes two retaining tabs perpendicularly extending from the base plate and each defines a notch. A resilient tab is formed on the base plate and extending between the retaining tabs. The retaining tabs are received in corresponding slits defined in a support panel. The circuit board retainer is moved with respect to the support panel for rendering the notches of the retaining tabs to engage with edges of the corresponding slits. The resilient tab is biased by the resiliency thereof to engage with an opening defined in the support panel thereby securely mounting the circuit board retainer to the support panel. A board connecting portion includes two resilient L-shaped members respectively extending from the side plates. Each L-shaped member has a first section perpendicularly extending from the corresponding side plate and a second section extending from the first section in a direction substantially parallel to the side plate. Wedge-shaped barbs are formed on opposite edges of the second section and are inclined with respect thereto. The second sections are forcibly inserted into a slot defined in a circuit board with an edge of the slot interposed between the barbs and the first sections thereby securely retaining the circuit board on the retainer.

17 Claims, 7 Drawing Sheets

CIRCUIT BOARD RETAINER

BACKGROUND OF THE INVENTION

1. Field of the Invention

The present invention generally relates to a device for retaining a circuit board, such as a computer main board, on a support panel, and in particular to a circuit board retainer allowing quick and ready mounting of the circuit board to the support panel.

2. The Prior Art

Personal computers comprise a main board fixed inside an enclosure. A support panel is used to support and mount the main board in the enclosure. The most straightforward manner to fix the main board to the support panel is bolts. Fixing a circuit board to a support panel by bolts, however, is a laborious and time-consuming process for many bolts are needed to effectively secure the main board on the support panel.

Taiwan Patent Application No. 82208473 and U.S. Pat. No. 5,671,124 disclose a retainer for retaining a main board in an enclosure. A bolt is still required for securing the main board to the retainer. Taiwan Patent Application No. 84211189 discloses a retainer for retaining a circuit board in an enclosure. An L-shaped projection is formed on the retainer for engaging and securing a circuit board. The L-shaped projection, however, is not capable to soundly fix the circuit board causing ineffective grounding of the circuit board.

Another example of a circuit board retainer is disclosed in Taiwan Patent Application No. 81212404 and U.S. Pat. No. 5,267,125. FIG. 7 of the attached drawings shows a circuit board retainer 99 disclosed in these patents for retaining a circuit board 130 on a support panel 150. The circuit board retainer 99 comprises a base plate 140 and two side plates 100, 120 extending from the base plate 140. An offset section 151 is formed on the support panel 150 defining a groove therebetween for slidably receiving side projections of the base plate 140 thereby retaining the retainer on the support panel 150. The side plates 100, 120 are spaced from each other and are made resilient for allowing the side plates 100, 120 to be inserted into a corresponding hole 131 defined in the circuit board 130. Notches 101, 121 are defined in opposite edges of each side plate 100, 120 whereby when the side plates 100, 120 are inserted into the hole 131, the resiliency thereof forces the notches 101, 121 to engage with a circumferential edge of the hole 131 thereby securing the circuit board 130 to the retainer 99.

In actual operation, to insert the side plates 100, 120 into the hole 131 requires manually compressing the side plates 100, 120. It would be a difficult job for a user to simultaneously handle three or more such retainers in mounting the circuit board to the retainers.

It is thus desired to provide a circuit board retainer for securing a circuit board to a support frame that overcomes the above problems.

SUMMARY OF THE INVENTION

Accordingly, an object of the present invention is to provide a circuit board retainer for retaining a circuit board on a support panel without using bolts.

Another object of the present invention is to provide a circuit board retainer having a simple structure.

A further object of the present invention is to provide a circuit board retainer for readily mounting a circuit board to a support panel.

To achieve the above objects, a circuit board retainer in accordance with the present invention comprises a U-shaped body portion having a base plate and two side plates extending from the base plate. A panel connecting portion comprises two retaining tabs perpendicularly extending from the base plate and each defines a notch. A resilient tab is formed on the base plate and extending between the retaining tabs. The retaining tabs are received in corresponding slits defined in a support panel. The circuit board retainer is moved with respect to the support panel for rendering the notches of the retaining tabs to engage with edges of the corresponding slits. The resilient tab is biased by the resiliency thereof to engage with an opening defined in the support panel thereby securely mounting the circuit board retainer to the support panel. A board connecting portion comprises two resilient L-shaped members respectively extending from the side plates. Each L-shaped member has a first section perpendicularly extending from the corresponding side plate and a second section extending from the first section in a direction substantially parallel to the side plate. Wedge-shaped barbs are formed on opposite edges of the second section and are inclined with respect thereto. The second sections are forcibly inserted into a slot defined in a circuit board with an edge of the slot interposed between the barbs and the first sections thereby securely retaining the circuit board on the retainer.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
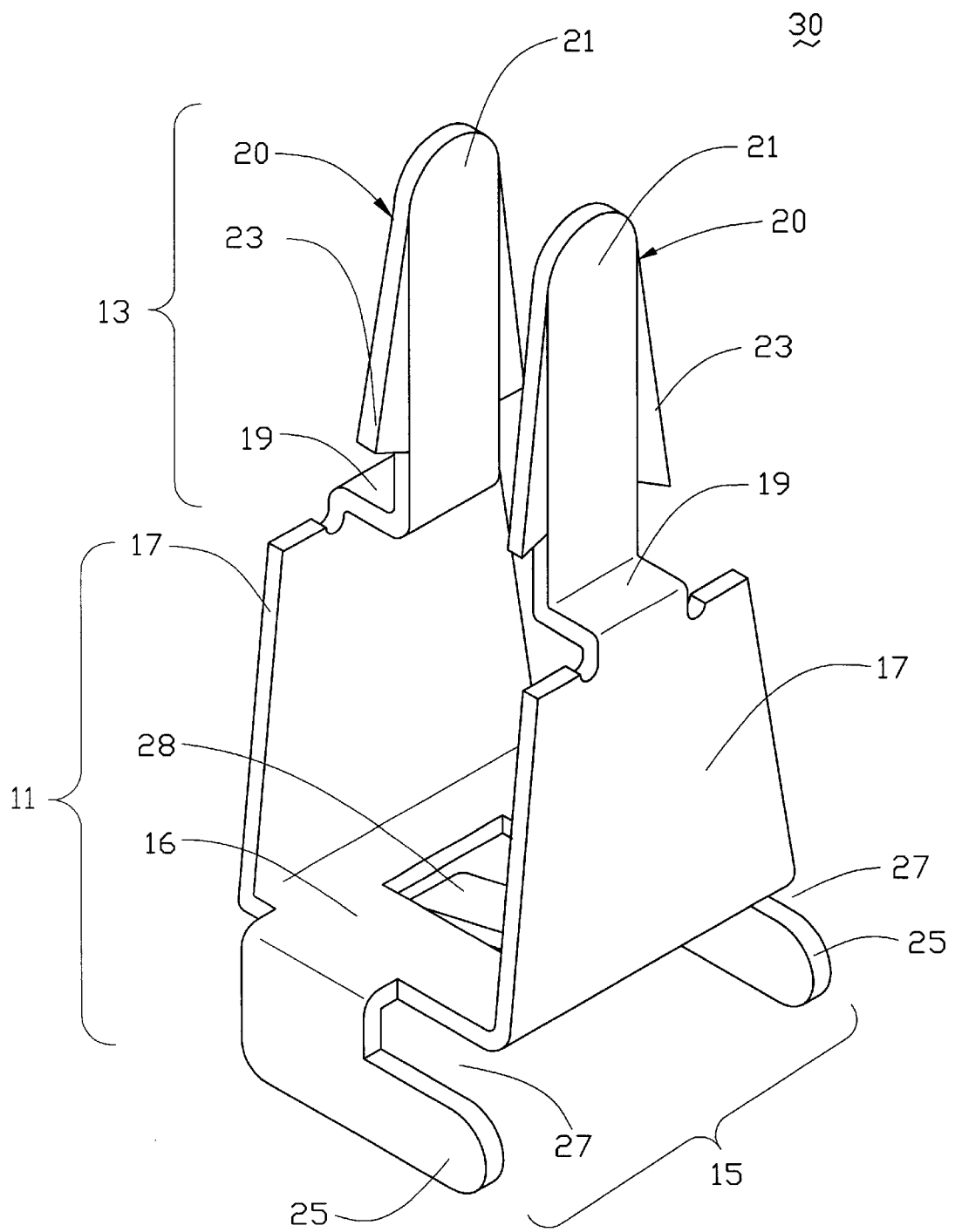
FIG. 1 is a perspective view of a circuit board retainer constructed in accordance with the present invention.
Figure 2:
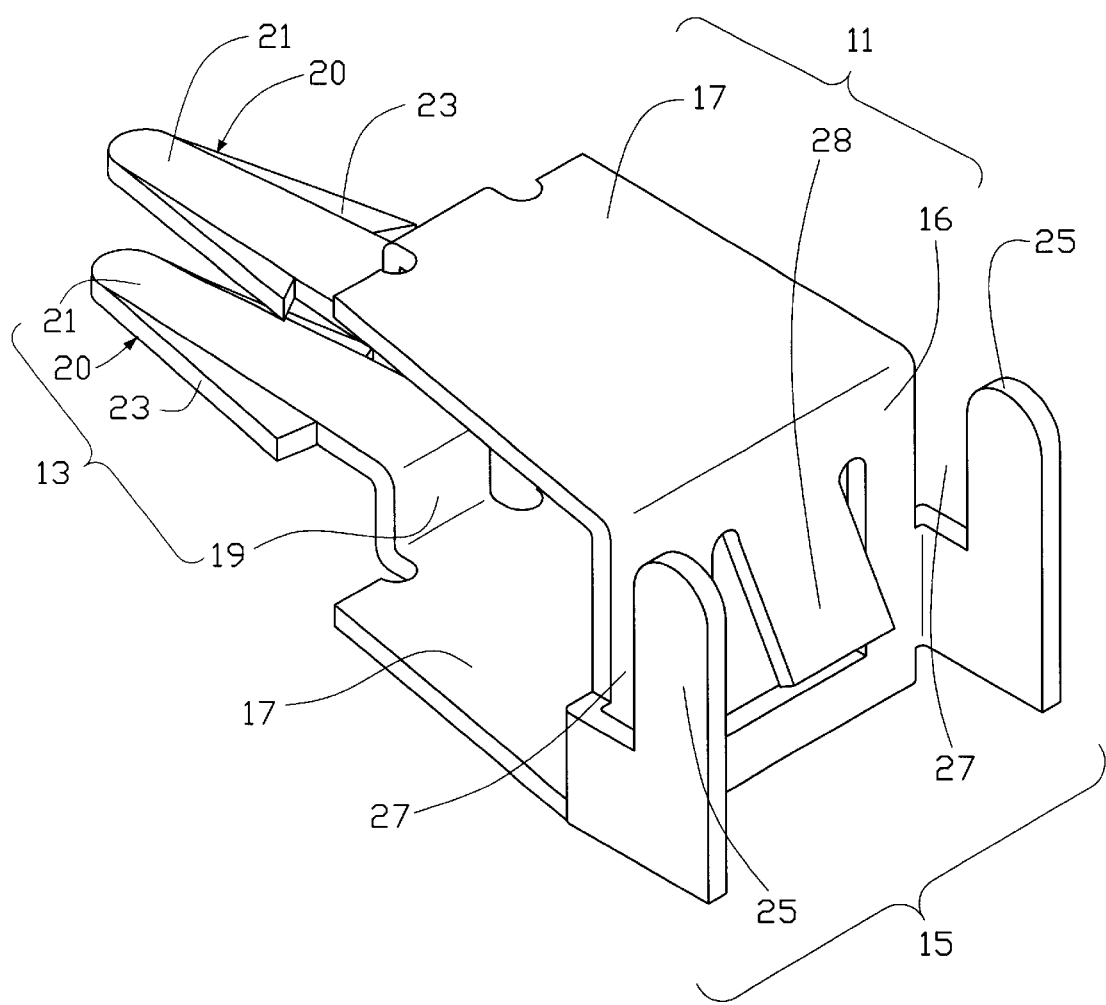
FIG. 2 is another perspective view of the circuit board retainer of the present invention.
Figure 3:
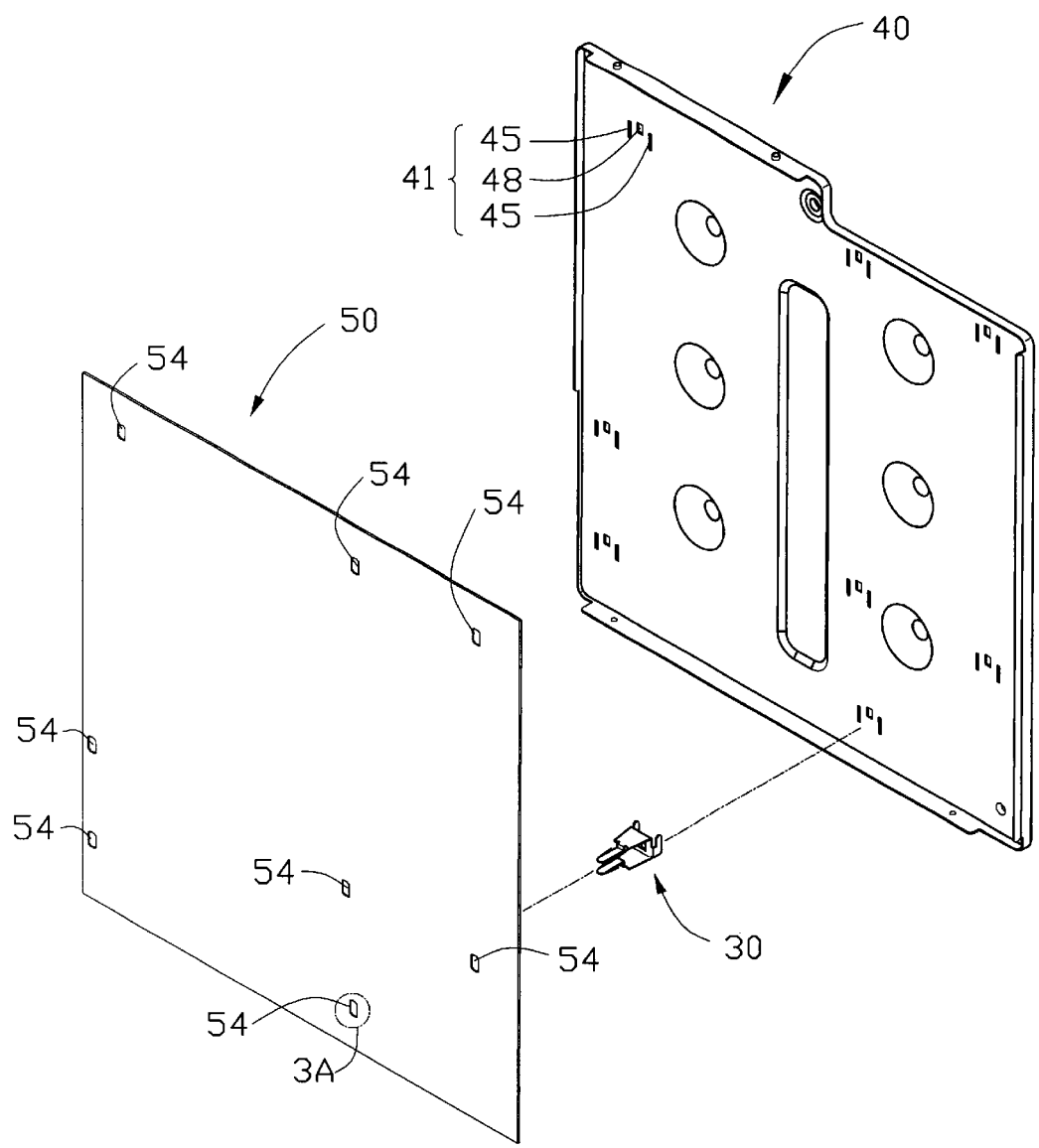
FIG. 3 is a perspective view illustrating the spatial relationship between the circuit board retainer of the present invention and a circuit board and a support panel.

Referring to the drawings and in particular to FIG. 3, a circuit board retainer constructed in accordance with the present invention, generally designated with reference numeral 30, is adapted to retain a circuit board 50 on a support panel 40. Also referring to FIGS. 1 and 2, the circuit board retainer 30 comprises a U-shaped body 11 with board connecting means 13 and panel connecting means 15 respectively formed on top and bottom sides thereof for connection with the circuit board 50 and the support panel 40.

The body 11 comprises a base plate 16 and two spaced side plates 17 extending from the base plate 16. The board connecting means 13 comprises a resilient L-shaped member having a first section 19 extending from each side plate 17 in a direction substantially normal thereto and a second section 21 extending from the first section 19 in a direction substantially parallel to the side plate 17. The second sections 21 of the L-shaped members of the board connecting means 13 are spaced from each other a distance smaller than that between the side plates 17. The space between the second sections 21 allows the second sections 21 to be resiliently deformable toward each other. Wedge-shaped barbs 23 are formed on opposite edges of each second section 21 of the board connecting means 13. The barbs 23 of the two L-shaped members are made inclined with respect to the corresponding second sections 21 and extending in opposite directions.

The panel connecting means 15 comprises two retaining tabs 25 extending from opposite edges of the base plate 16 in a direction substantially normal thereto. A notch 27 is defined between the base plate 16 and each tab 25. A resilient tab 28 is formed on an underside of the base plate 16 and located between the tabs 25. The resilient tab 28 extends at an angle with respect to the base plate 16 thereby inclined relative to the base plate 16. Preferably, the resilient tab 28 is formed by stamping the base plate 16 as shown in the drawings.

Figure 3A:
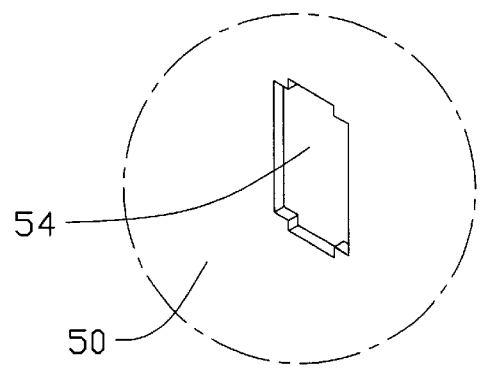
FIG. 3A is an enlarged view of encircled portion 3A of FIG. 3.

Referring back to FIG. 3, to be connected to the circuit board retainer 30, the circuit board 50 defines a slot 54 (also see FIG. 3A) for receiving the L-shaped members 20 of the board connecting means 13 and engaging with the barbs 23 thereof and the support panel 40 forms engaging means 41 comprising a pair of slits 45 defined in the support panel 40 for receiving the retaining tabs 25 of the panel connecting means 15 and an opening 48 for engaging with the resilient tab 28.

Figure 4:
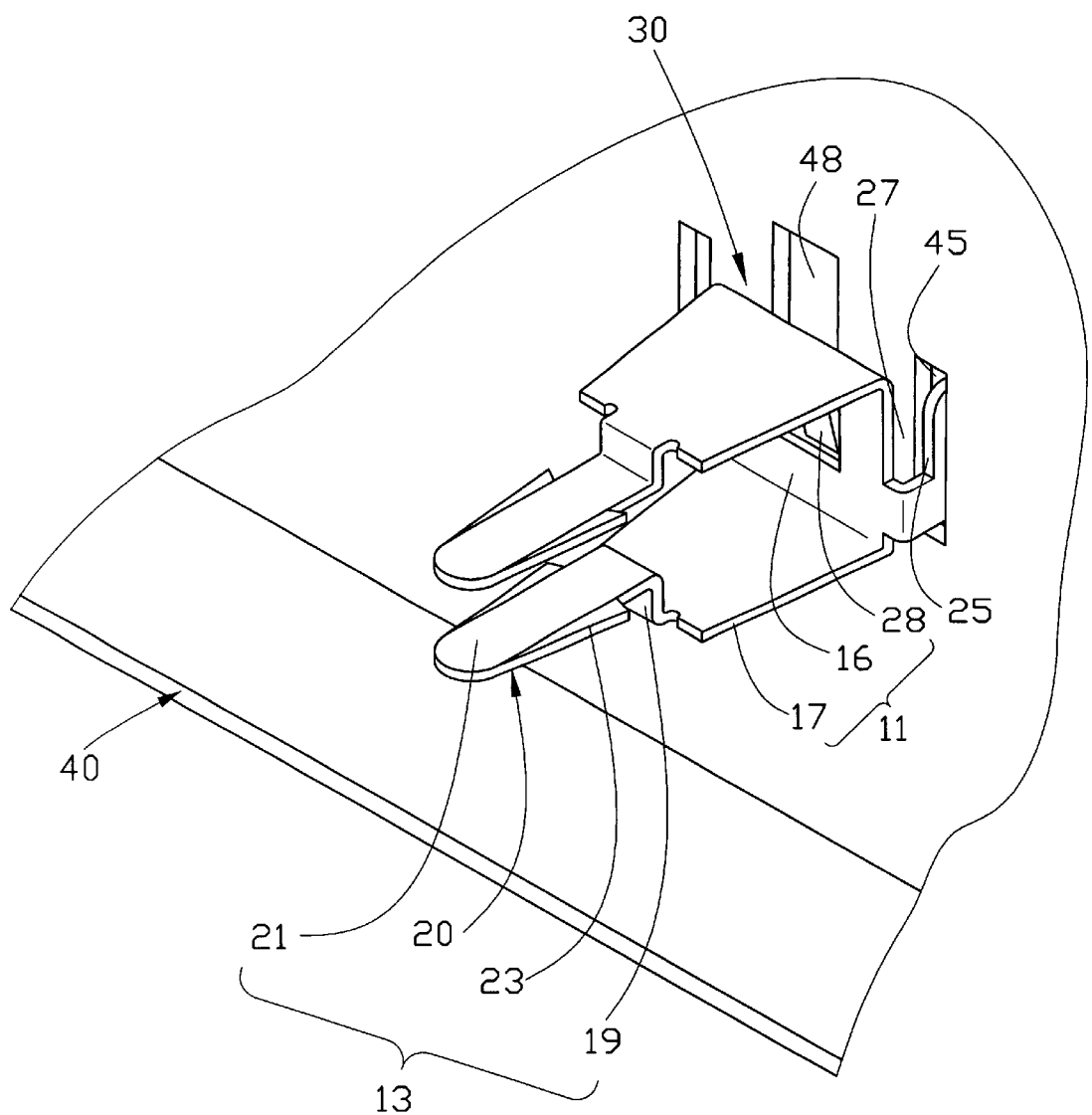
FIG. 4 shows an initial phase when the circuit board retainer is mounted to the support panel.
Figure 5:
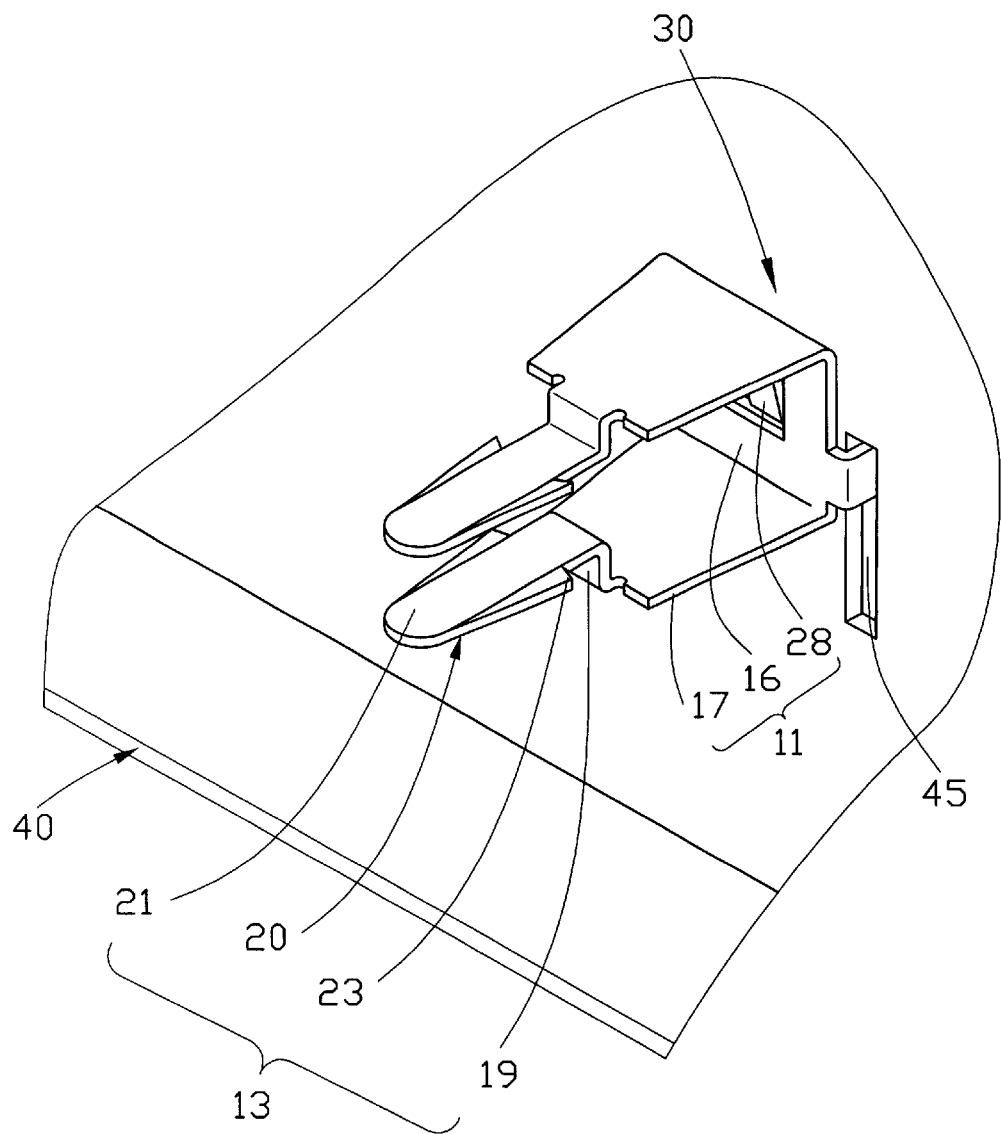
FIG. 5 shows a final phase when the circuit board retainer is mounted to the support panel.

Referring to FIGS. 4 and 5, to mount the circuit board retainer 30 to the support panel 40, the retaining tabs 25 are aligned with and moved into the slits 45 of the support panel 40 with the notches 27 substantially aligned with an edge of each slit 45 as shown in FIG. 4. At this moment, the resilient tab 28 is contacted by the support panel 40 and resiliently deformed thereby. By moving the circuit board retainer 30 relative to the support panel 40 in a sliding direction, the edges of the slits 45 are moved into the corresponding notches 27 of the retaining tabs 25 and engage therewith. In this respect, the retaining tabs 25 may have rounded ends for effectively guiding the edges of the slits 45 into the notches 27 thereof. The movement of the circuit board retainer 30 causes the resilient tab 28 to move to the opening 48 and due to the resiliency thereof, the resilient tab 28 is biased to engage the opening 48 thereby securely mounting the circuit board retainer 30 to the support panel 40 as shown in FIG. 5.

Figure 6:
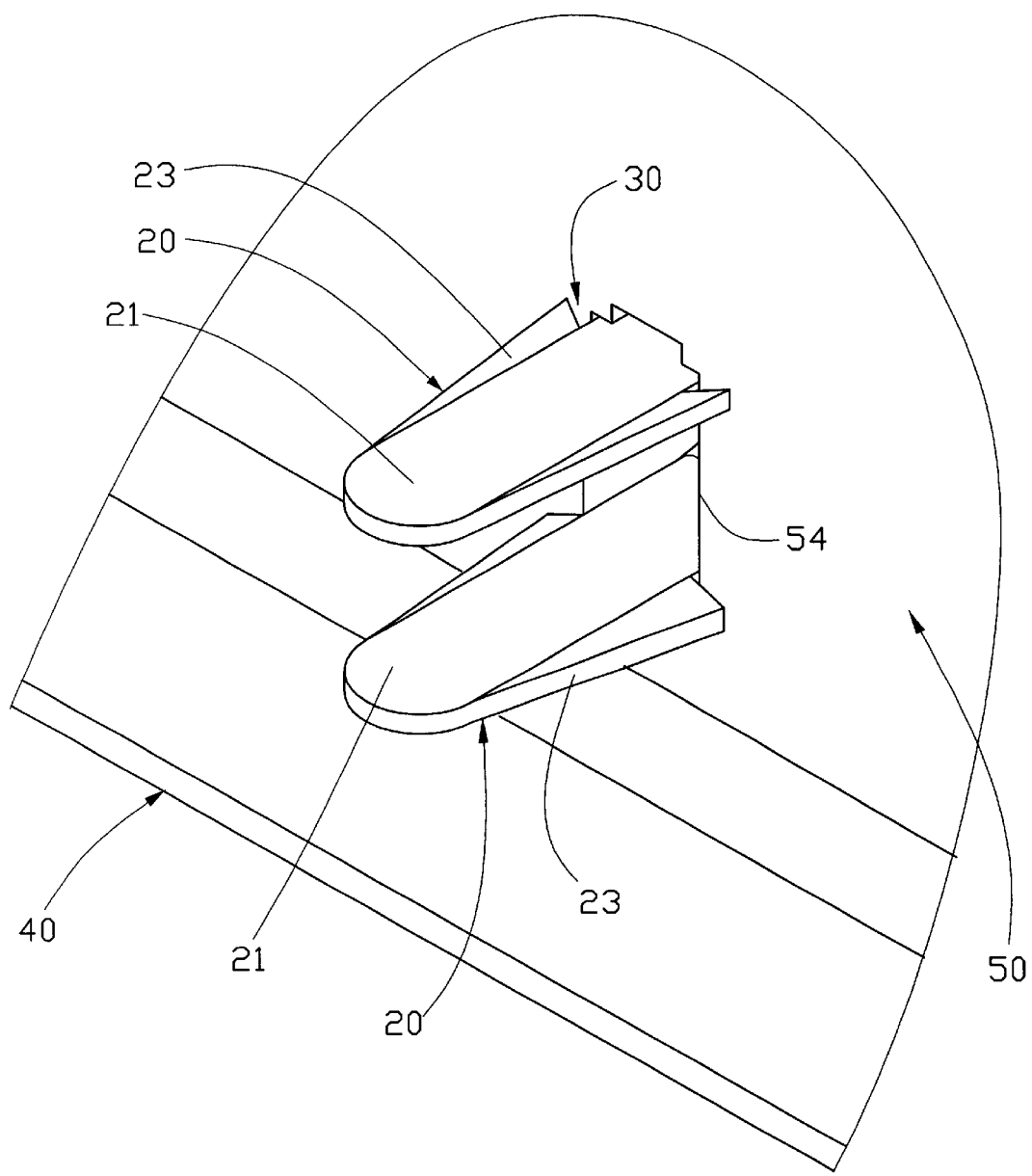
FIG. 6 shows the circuit board retainer engaging with the circuit board.
Figure 7:
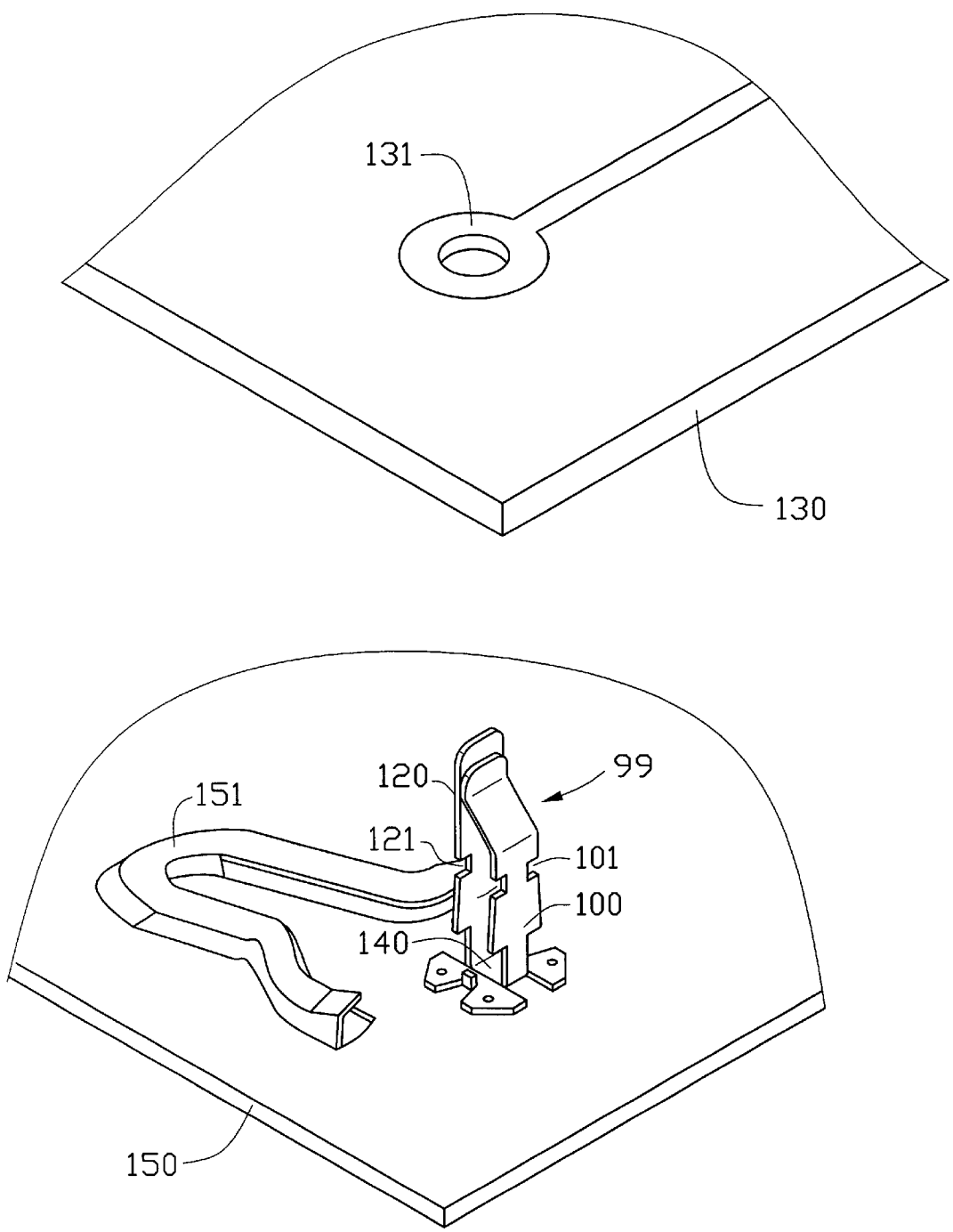
FIG. 7 is a perspective view of a conventional circuit board retainer for retaining a circuit board on a support panel.

Referring to FIG. 6, to mount the circuit board 50 to the circuit board retainer 30, the L-shaped members 20 are forcibly inserted into the slot 54 of the circuit board 50 whereby the barbs 23 and the second sections 21 are elastically deformed to allow the second sections 21 to substantially extend beyond the slot 54 to such an extend that the barbs 23 engage with edges of the slot 54. Preferably, the second sections 21 have rounded free ends for facilitating insertion of the L-shaped members 20 into the slot 54. The first sections 19 of the L-shaped members 20 form shoulders for supporting the circuit board 50 whereby the circuit board 50 is interposed between the first sections 19 and the barbs 23 and thus securely retaining the circuit board 50 on the circuit board retainer 30.

Although the present invention has been described with reference to the preferred embodiment, it is apparent to those skilled in the art that a variety of modifications and changes may be made without departing from the scope of the present invention which is intended to be defined by the appended claims.

What is claimed is:

1. A retainer for retaining a circuit board on a support panel comprising:

a body having first and second sides;

board connecting means formed on the first side of the body for engaging with the circuit board, the board connecting means comprising two spaced resilient members extending from the first side of the body for being inserted into a slot defined in the circuit board by being resiliently deformed, opposite edges of each resilient member extending outwardly and inclined with respect to the plane of the resilient member to form barbs, the barb being wedge-shaped and adapted to engage with an edge of the slot for retaining the circuit board on the retainer; and panel connecting means formed on the second side of the body for engaging with the support panel thereby supporting the circuit board on the support panel, the panel connecting means comprising spaced retaining tabs extending from the second side of the body for being respectively received in slits defined in the support panel, each retaining tab defining a notch for engaging with an edge of the corresponding slit by moving the retainer with respect to the support panel thereby mounting the retainer to the support panel.

2. The retainer as claimed in claim 1, wherein a resilient tab is formed on the second side of the body for being contacted and resiliently deformed by the support panel when the retaining tabs are received in the slits, the resilient tab being biased by the resiliency thereof to engage with an opening defined in the support panel thereby securely mounting the retainer to the support panel.

3. The retainer as claimed in claim 1, wherein the resilient members of the board connecting means are L-shaped comprising a first section extending from the body and a second section extending from the first section in a direction substantially normal thereto, the barbs being formed on opposite edges of the second section of each L-shaped member, the first section forming a shoulder for supporting the circuit board whereby the circuit board is interposed between the barbs and the first sections.

4. The retainer as claimed in claim 1, wherein the body is U-shaped comprising a base plate and two spaced side plates extending from the base plate, the retaining tabs of the panel connecting means extending from the base plate in a direction substantially normal thereto, the resilient members of the board connecting means respectively extending from the side plates.

5. The retainer as claimed in claim 4, wherein a resilient tab is formed on an underside of the base plate of the body for being contacted and resiliently deformed by the support panel when the retaining tabs are received in the slits, the resilient tab being biased by the resiliency thereof to engage with an opening defined in the support panel thereby securely mounting the retainer to the support panel.

6. The retainer as claimed in claim 5, wherein the resiliently tab is stamped on the base plate of the body.

7. The retainer as claimed in claim 6, wherein the resilient members of the board connecting means are L-shaped comprising a first section extending from each side plates of the body in a direction substantially normal thereto and a second section extending from the first section in a direction substantially parallel to the corresponding side plate, the barbs being formed on opposite edges of the second section of each L-shaped member, the first section forming a shoulder for supporting the circuit board whereby the circuit board is interposed between the barbs and the first sections.

8. The retainer as claimed in claim 1, the resilient member has round ends.

9. A circuit board assembly comprising:

a support panel defining a pair of slits and an opening therethrough;

a circuit board defining a slot therein; and a plurality of retainers connecting the circuit board to the support panel, each retainer comprising:

a body having first and second sides, board connecting means comprising two spaced resilient members extending from the first side of the body for being inserted into the slot defined in the circuit board by being resiliently deformed, wedge-shaped barbs being formed on opposite edges of each resilient member adapted to engage with an edge of the slot for retaining the circuit board on the retainer, and panel connecting means comprising two spaced retaining tabs extending from the second side of the body for being respectively received in the slits defined in the support panel, each retaining tab defining a notch for engaging with an edge of the corresponding slit by moving the retainer with respect to the support panel thereby mounting the retainer to the support panel, a resilient tab formed on the second side of the body for being contacted and resiliently deformed by the support panel when the retaining tabs are received in the slits, the resilient tab being biased by the resiliency thereof to engage with the opening of the support panel thereby securely mounting the retainer to the support panel.

10. The circuit board assembly as claimed in claim 9, wherein the resilient members of the board connecting means are L-shaped comprising a first section extending from the body and a second section extending from the first section in a direction substantially normal thereto, the barbs being formed on opposite edges of the second section of each L-shaped member, the first section forming a shoulder for supporting the circuit board whereby the circuit board is interposed between the barbs and the first sections.

11. The circuit board assembly as claimed in claim 9, wherein the body is U-shaped comprising a base plate and two spaced side plates extending from the base plate, the retaining tabs of the panel connecting means extending from the base plate in a direction substantially normal thereto, the resilient members of the board connecting means respectively extending from the side plates.

12. The circuit board assembly as claimed in claim 11, wherein the support panel defines an opening and wherein a resilient tab is formed on an underside of the base plate of the body for being contacted and resiliently deformed by the support panel when the retaining tabs are received in the slits, the resilient tab being biased by the resiliency thereof to engage with the opening of the support panel thereby securely mounting the retainer to the support panel.

13. The circuit board assembly as claimed in claim 12, wherein the resiliently tab is stamped on the base plate of the body.

14. The circuit board assembly as claimed in claim 12, wherein the resilient members of the board connecting means are L-shaped comprising a first section extending from each side plates of the body in a direction substantially normal thereto and a second section extending from the first section in a direction substantially parallel to the corresponding side plate, the barbs being formed on opposite edges of the second section of each L-shaped member, the first section forming a shoulder for supporting the circuit board whereby the circuit board is interposed between the barbs and the first sections.

15. The circuit board assembly as claimed in claim 9, wherein the barbs are inclined with respect to the resilient members.

16. The retainer as claimed in claim 9, the resilient member has round ends.

17. A retainer assembly for use with a circuit board, comprising:

a retainer body defining first and second sides;

board connecting means formed on the first side and defining at least a support section and a barb for retainably sandwithing said circuit board therebetween;

panel connecting means formed on the second side and defining at least a retaining tab with a notch thereabouts, and a resilient tab; and a panel positioned below the retainer body, said panel defining at least a slit dimensioned to allow the retainer tab to extend therethrough and to have edges around the slit latchably engaged within the notch for retaining relative vertical or lateral movement between the panel and the retainer body after the retainer body is moved with regard to the panel in a sliding direction, and further defining an opening through the panel, the resilient tab being latchably engaged in the opening when the retainer body is moved to a final position in said sliding direction for preventing backward movement of the retainer body with regard to the panel.

* * * * *